(12) United States Patent
Kim

(10) Patent No.: US 9,411,179 B2
(45) Date of Patent: Aug. 9, 2016

(54) ASSEMBLY APPARATUS FOR A DISPLAY DEVICE

(71) Applicant: Samsung Display Co., LTD., Yongin, Gyeonggi-Do (KR)

(72) Inventor: Hong-Am Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 73 days.

(21) Appl. No.: 13/972,310

(22) Filed: Aug. 21, 2013

(65) Prior Publication Data

US 2014/0311679 A1 Oct. 23, 2014

(30) Foreign Application Priority Data

Apr. 22, 2013 (KR) .................. 10-2013-0044253

(51) Int. Cl.
| | |
|---|---|
| H05K 3/00 | (2006.01) |
| G02F 1/13 | (2006.01) |
| B65C 9/18 | (2006.01) |
| B65C 1/02 | (2006.01) |
| H05K 1/18 | (2006.01) |
| G02F 1/1333 | (2006.01) |

(52) U.S. Cl.
CPC .............. *G02F 1/1303* (2013.01); *B65C 1/021* (2013.01); *B65C 9/1884* (2013.01); *G02F 2001/133325* (2013.01); *G02F 2202/28* (2013.01); *H05K 1/189* (2013.01); *H05K 2201/10128* (2013.01); *Y10T 156/17* (2015.01)

(58) Field of Classification Search
CPC .... B65C 9/1884; B65C 1/021; Y10T 156/17; G02F 1/1303
USPC ......................................... 156/521, 542, 556
See application file for complete search history.

(56) References Cited

U.S. PATENT DOCUMENTS 6,318,436 B1 * 11/2001 Hummell et al. ............. 156/556
2006/0185796 A1 * 8/2006 Hayasaka et al. ............. 156/556

FOREIGN PATENT DOCUMENTS

| JP | 2010056141 | 3/2010 |
| KR | 1020060129644 | 12/2006 |
| KR | 101151827 | 6/2012 |

* cited by examiner

*Primary Examiner* — Philip Tucker
*Assistant Examiner* — John Blades
(74) *Attorney, Agent, or Firm* — Robert E. Bushnell, Esq.

(57) ABSTRACT

An assembly apparatus for a display device includes a panel support member for supporting a display panel; a tape attaching module for attaching a cover panel tape to the display panel; and a pocket member holding a connector of a flexible printed circuit board attached to the cover panel tape.

14 Claims, 8 Drawing Sheets

ASSEMBLY APPARATUS FOR A DISPLAY DEVICE

CLAIM OF PRIORITY

This application claims priority to and the benefit of Korean Patent Application No. 10-2013-0044253 filed in the Korean Intellectual Property Office on Apr. 22, 2013, the entire contents of which are incorporated herein by reference.

BACKGROUND OF THE INVENTION

1. Field of the Invention

The described technology relates generally to an assembly apparatus for a display device. Particularly, the described technology relates generally to an assembly apparatus for a display device for attaching a cover panel tape and a flexible printed circuit board to a display panel.

2. Description of the Related Art

An organic light emitting diode display is a self-emissive display device that has an organic light emitting diode that is capable of emitting light by itself to display an image. Light is emitted by energy generated when excitons, generated when electrons and holes are combined, drop from an excited state to a ground state, and the organic light emitting diode display displays an image by using the light.

In a module assembly process of the organic light emitting display device, a cover panel tape for preventing light leakage on a rear side of a cell and reinforcing a light characteristic of a front side is attached to the rear side of the cell, and a flexible printed circuit board for supplying a power voltage and a driving signal to the cell is attached to the cover panel tape.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an assembly apparatus for a display device for improving productivity of a module assembly process.

An exemplary embodiment provides an assembly apparatus for a display device, including: a panel support member supporting a display panel; a tape attaching module being capable of attaching a cover panel tape to the display panel; and a pocket member being capable of holding a connector of a flexible printed circuit board that is to be attached to the cover panel tape.

The tape attaching module is capable of proceeding toward or retreating from the panel support member. The tape attaching module may include: a stage being capable of holding the cover panel tape in a vacuum manner; a stage driver rotating the stage with respect to a second end of the stage so that the stage is capable of maintaining a horizontal state or an inclined state with respect to the display panel; a main body supporting the stage and the stage driver; and a main body driver driving the tape attaching module to proceed toward the panel support member or to retreat from the panel support member.

The tape attaching module further includes a roller installed at a first end of the stage.

The main body driver includes: a guide member extending in a horizontal direction heading to the panel support member; and a driving unit installed to the main body. The guide member may guide the proceeding or retreating of the tape attaching module, and the driving unit may be combined with the guide member in a linearly movable manner.

The stage driver includes: a linear driving unit installed to the main body; and a connection link connecting the linear driving unit to the second end of the stage. The connection link includes a first end combined with a driving shaft of the linear driving unit in a pivot-rotatable manner, and a second end combined with the second end of the stage in a pivot-rotatable manner.

The tape attaching module further includes an absorber for alleviating an impact occurring when the stage is rotated.

The pocket member is disposed at a first side surface of the panel support member. The pocket member is movable upward or downward.

A top surface of the pocket member is formed with a groove having a shape that matches with a shape of the connector of the flexible printed circuit board.

The panel support member holds the display panel in a vacuum manner and supports the display panel.

The display panel includes an organic light emitting display panel. A displaying side of the organic light emitting display panel facing the panel support member. The cover panel tape is attached to an opposite side of the displaying side of the organic light emitting panel.

According to an embodiment, the assembly apparatus for a display device for reducing the number of processes and increasing job efficiency by sequentially performing the process for attaching the cover panel tape to the panel and the process for attaching the cover panel tape to the flexible printed circuit board is provided.

BRIEF DESCRIPTION OF THE DRAWINGS

The drawings described below are for the purpose of illustration only and are not intended to limit the range of the present invention.

DETAILED DESCRIPTION

Figure 1:
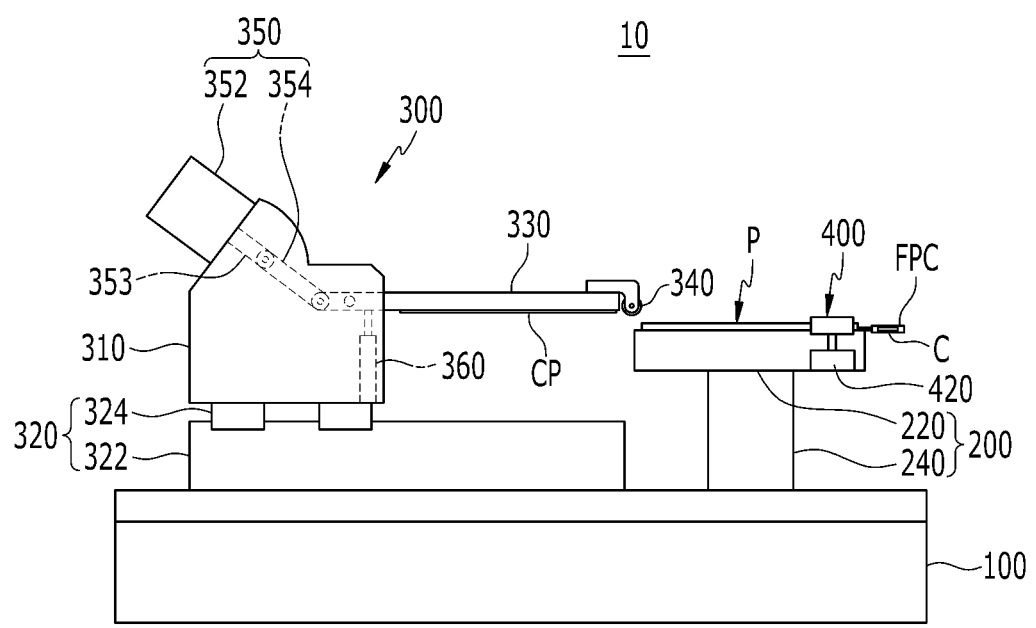
FIG. 1 shows a side view of an assembly apparatus for a display device according to an exemplary embodiment.

The present invention can be variously changed and can have various forms, but the specific exemplary embodiments illustrated in the drawings will be described in detail. However, it should be understood that the exemplary embodiments are not intended to limit the present invention, and various changes, modifications, and equivalents may be included within the spirit and scope of the present invention.

In the explanations of each drawing, like numbers are used for like constituent elements. In the accompanying drawings, the dimensions of the structure are exaggerated and shown for clarity of the present invention. The terms of first, second, or the like may be used to describe the various constituent elements, but the constituent elements should not be limited by the above terms. The terms are only used to distinguish one constituent element from another constituent element. For example, a first constituent element could be termed a second constituent element, and similarly, a second constituent element could be termed as a first constituent element, without departing from the scope of the present invention. Unless explicitly described to the contrary, the representation of the singular includes a plurality of representation.

In this application, it should be understood that the terms such as "comprises" or "having" is to specify the presence of features, numbers, steps, operations, constituent elements, parts, or any combination of them described in the specification, but it does not preclude possibility of the presence or addition of one or more other features, numbers, steps, operations, constituent elements, parts, or any combination of them. When a portion of a layer, film, region, plate, or the like is referred to as being "on" another portion, it can be directly on the other portion, or intervening portion may be present. In contrast, when a portion of a layer, film, region, plate, or the like is referred to as being "below" another portion, it can be directly below the other portion, or intervening portions may be present.

Hereinafter, referring to FIG. 1 to FIG. 7, a preferred exemplary embodiment will be described in detail.

Figure 2:
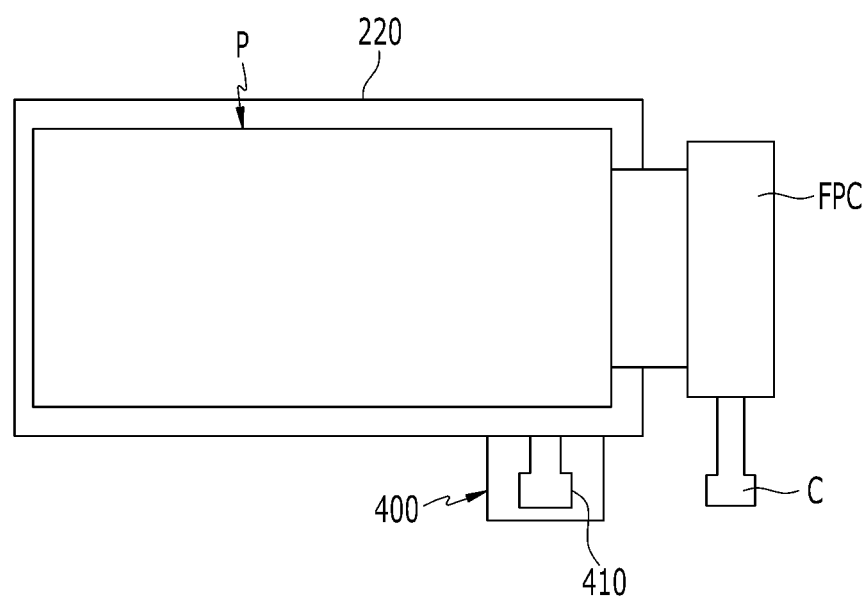
FIG. 2 shows a top plan view of a support substrate to which a display panel is loaded and a pocket member shown in FIG. 1.

FIG. 1 shows a side view of an assembly apparatus for a display device according to an exemplary embodiment, and FIG. 2 shows a top plan view of a support substrate to which a display panel is loaded and a pocket member shown in FIG. 1.

Referring to FIG. 1 and FIG. 2, an assembly apparatus 10 for a display device includes a base 100, a panel support member 200, a tape attaching module 300, and a pocket member 400.

The assembly apparatus 10 for a display device is provided for a module assembly process, and in detail, the module assembly process may comprise a process for attaching a cover panel tape CP to the display panel P and a process for attaching the flexible printed circuit board (FPCB) FPC to the top surface of the cover panel tape CP.

The panel support member 200 and the tape attaching module 300 are provided on the base 100, and the pocket member 400 is provided on one side of the panel support member 200.

The panel support member 200 includes a support substrate 220 and a support shaft 240. The support substrate 220 is provided as a rectangular parallelepiped with a quadrangular cross-section. A top of the support shaft 240 is perpendicularly combined to a bottom of the support substrate 220, and a bottom of the support shaft 240 is combined to a top of the base 100.

The support substrate 220 can support the display panel P, for example, an organic light emitting display panel. The display panel P is provided on the support substrate 220 so that a tape-attached side of the display panel P, which is an opposite side of a displaying side of the display panel P, on which images are displayed, may face upward. In other words, the displaying side of the display panel P faces the support substrate 220. The display panel P can be held by a vacuum member (not shown) provided to the support substrate 220 in a vacuum manner. Herein, the vacuum manner means to hold or support an object by force initiated by vacuum.

The tape attaching module 300 attaches the cover panel tape CP to the tape-attached side of the display panel P supported by the support substrate 220. The cover panel tape CP prevents leakage of light through the tape-attached side and reinforces the light characteristic of the displaying side.

The tape attaching module 300 includes a main body 310, a main body driver 320, a stage 330, a roller 340, a stage driver 350, and an absorber 360. The main body 310 supports the stage 330 and the stage driver 350, and the main body driver 320 controls the main body 310 to proceed toward the panel support member 200 or retreat from the panel support member 200.

The main body driver 320 includes a guide member 322 and a driving unit 324. The guide member 322 may be a linear motor (LM) guide, and can be extended in a horizontal direction heading to the panel support member 200 on the top of the base 100. The driving unit 324 may include a linear motor. The main body 310 is installed with the driving unit 324, and the driving unit 324 is combined to the guide member 322 in a linearly movable manner.

The stage 330 can be provided as a rectangular parallelepiped having a quadrangular cross-section. The cover panel tape CP can be held on the bottom of the stage 330 in a vacuum manner by a vacuum member (not shown) provided to the stage 330.

The roller 340 is installed to a first end of the stage 330 in a rotatable manner, and the main body 310 is combined to a second end of the stage 330. The roller 340 applies pressure to the cover panel tape CP, once the cover panel tape CP is provided on the display panel (P) to attach the cover panel tape CP to the display panel P, the process of which will be described later.

The stage driver 350 rotates the stage 330 with respect to a second end of the stage 330 so that the stage 330 may be in a horizontal or inclined state. The stage driver 350 includes a linear driving unit 352 and a connection link 354.

For example, the linear driving unit 352 may be a pneumatic cylinder or a hydraulic cylinder, and it is combined with the main body 310. The connection link 354 connects a driving shaft 353 of the linear driving unit 352 to the second end of the stage 330. In detail, the connection link 354 includes a first end combined to the driving shaft 353 of the linear driving unit 352 in a pivot-rotatable manner, and a second end combined to the second end of the stage 330 in a pivot-rotatable manner. Herein, the pivot-rotatable manner indicates a coupling of two objects that can initiate a rotation of one of the objects about a pivot point of the one of the objects.

When the driving shaft 353 of the linear driving unit 352 is expanded, the connection link 354 is rotated in a clockwise direction, and then the stage 330 is rotated in a counterclockwise direction, making the stage 330 rotate in an upward direction, which is an inclined state. On the contrary, when the driving shaft 353 of the linear driving unit 352 contracts, the connection link 354 is rotated in the counterclockwise direction, and the stage 330 is rotated in the clockwise direction, making the stage 330 move in a downward direction from the inclined state.

The absorber 360 is used to alleviate an impact that occurs when the stage 330 is rotated in a pivot manner by the linear driving unit 352 and the connection link 354

The absorber 360 includes a first end fixed to and supported by the main body 310 and a second end supported by the stage 330. The absorber 360 controls a rotation intensity of the stage 330 to prevent application of an impact to the display panel P by the stage 330.

In addition, the display panel P provided on the support substrate 220 of the panel support member 200 is connected to a first end of the flexible printed circuit board (FPCB) FPC, and the flexible printed circuit board (FPCB) FPC is combined with a connector C for applying a power voltage and a driving signal to the display panel P.

A second end of the flexible printed circuit board (FPCB) is bent and attached to the cover panel tape CP while the cover panel tape CP is attached to the tape-attached side of the display panel P. In this instance, the connector C of the flexible printed circuit board (FPCB) FPC is supported by the pocket member 400.

The pocket member 400 is combined with a first side surface of the support substrate 220 of the panel support member 200, and a groove 410 (shown in FIG. 2), having a shape that corresponds to the connector C of the flexible printed circuit board (FPCB) FPC, is formed on top surface of the pocket member 400. The groove 410 is capable of holding the connector C. The pocket member 400 is movable up and down by a linear driving member 420 so that it may not interfere with the roller 340 of the tape attaching module 300 during a process for attaching the cover panel tape CP. For example, the linear driving member 420 may be a pneumatic cylinder or a hydraulic cylinder.

A process for attaching a cover panel tape CP to a display panel P by using the above-configured assembly apparatus 10 for a display device and a process for a flexible printed circuit board (FPCB) FPC thereto will now be described.

Figure 3:
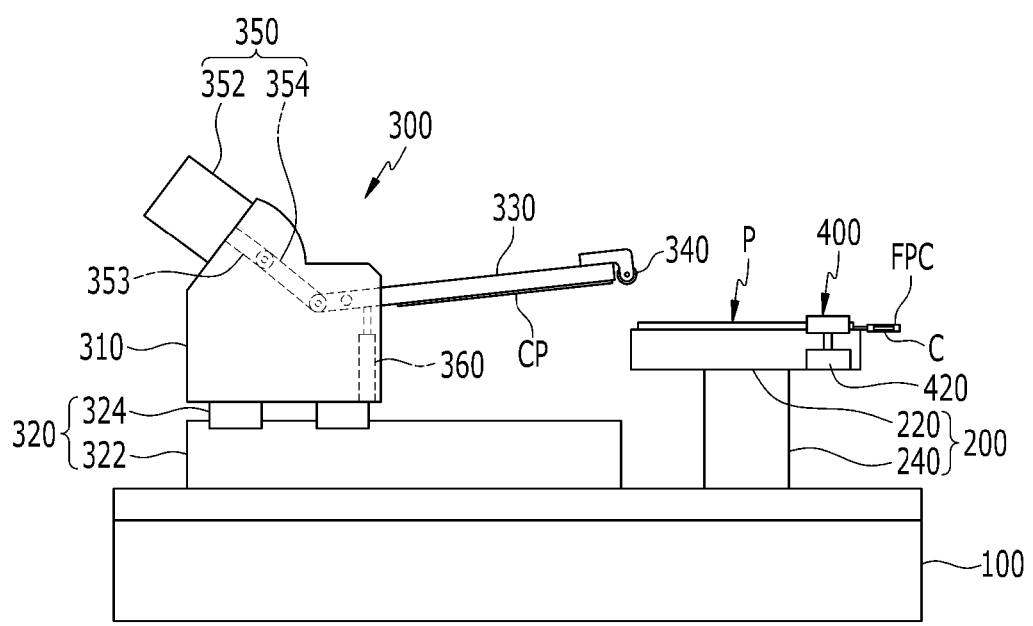
FIG. 3 shows a state for a tape attaching module to absorb a cover panel tape in a vacuum manner.
Figure 4:
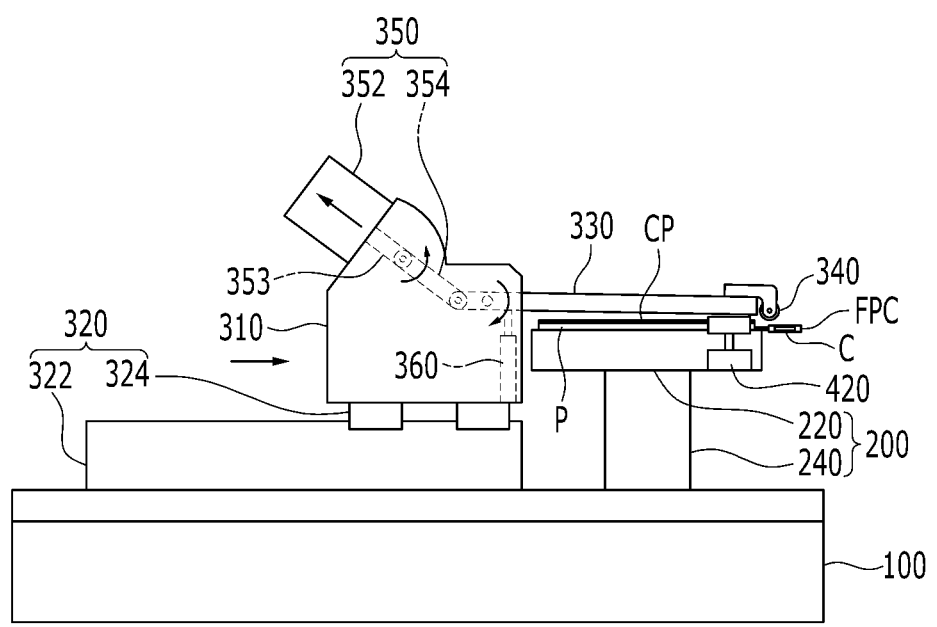
FIG. 4 shows a state in which a tape attaching module is moved to a process position at a top of a panel support member.
Figure 5:
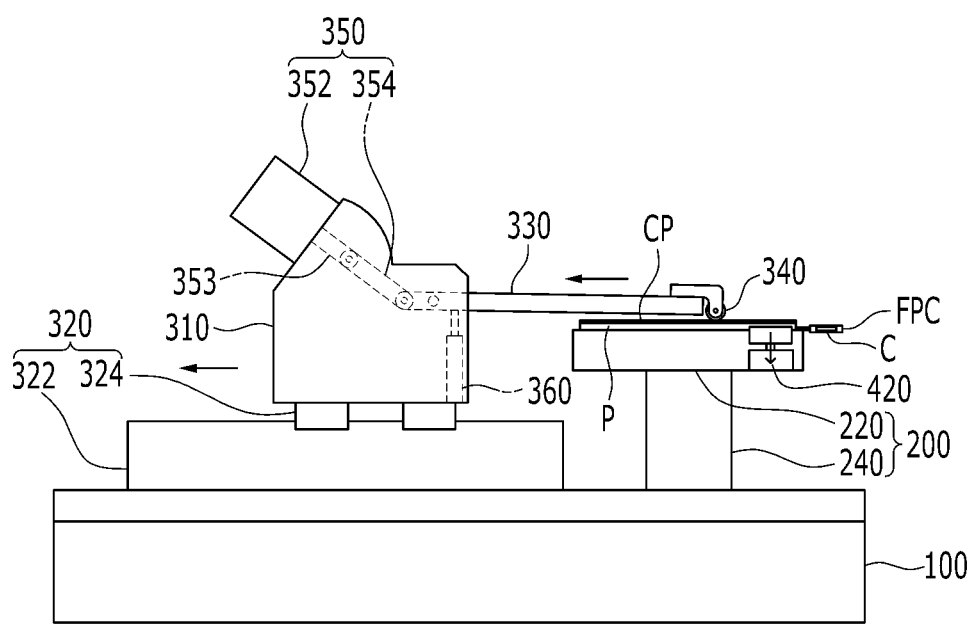
FIG. 5 shows an operation for a tape attaching module to attach a cover panel tape to a display panel.
Figure 8:
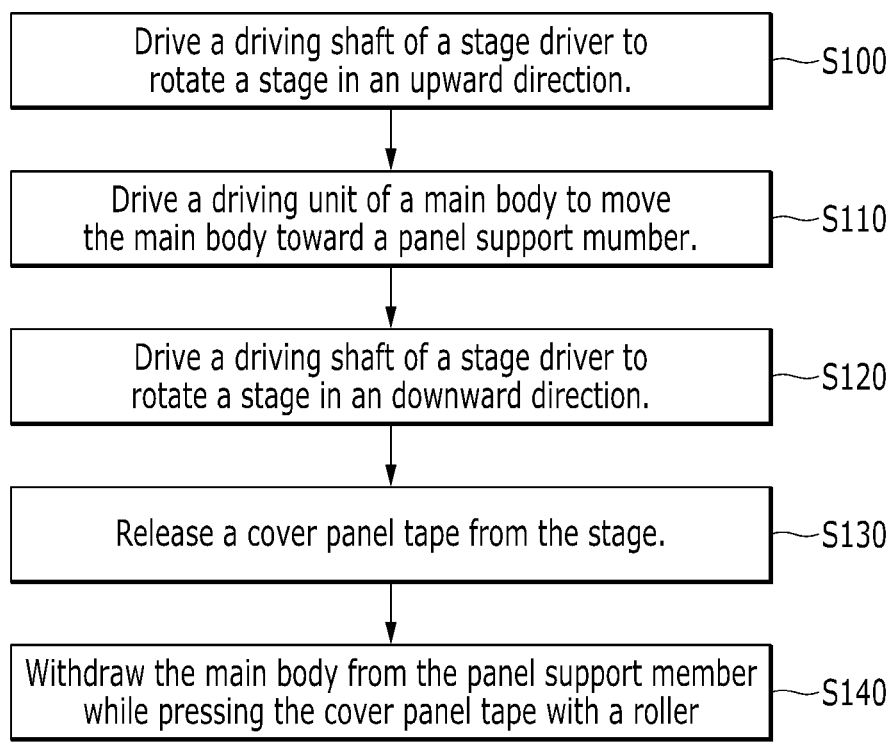
FIG. 8 shows a flowchart that illustrates the processes for attaching a cover panel tape to a display panel.

FIG. 3 shows a state for a tape attaching module to hold a cover panel tape in a vacuum manner, FIG. 4 shows a state in which a tape attaching module is moved to a process position at a top of a panel support member, and FIG. 5 shows an operation for a tape attaching module to attach a cover panel tape to a display panel. FIG. 8 shows a flowchart that illustrates the processes for attaching a cover panel tape to a display panel.

Referring to FIG. 3 to FIG. 5, a release paper (not shown) may be attached to the top surface of the cover panel tape CP, and the cover panel tape CP, to which the release paper (not shown) is attached, is held to a bottom surface of the stage 330 in a vacuum manner. The display panel P is loaded to the top surface of the support substrate 220 of the panel support member 200.

The stage 330 can be rotated in the upward inclined direction so as to move to a process position at the top of the panel support member 200. In detail, in this process, the driving shaft 353 of the linear driving unit 352 is expanded, the connection link 354 is rotated in the clockwise direction, and the stage 330 is rotated in the counterclockwise direction. The stage 330, which is rotated in the counterclockwise direction, may rotate in upward direction to maintain the inclined state, as shown in FIG. 3 (S100).

When the main body driver 320 moves the main body 310 toward the panel support member 200, the stage 330 holding the cover panel tape CP in a vacuum manner moves to the process position at the top of the support substrate 220 from a standby position (S110).

When the stage 330 reaches the top of the support substrate 200, the stage 330 may be rotated in a downward direction so as to load the cover panel tape CP over the display panel P disposed on the support substrate 220, as shown in FIG. 4 (S120). In detail, in this process, the driving shaft 353 of the linear driving unit 352 contracts, the connection link 354 is rotated in the counterclockwise direction, and the stage 330 is rotated in the clockwise direction. The stage 330 that is rotated in the clockwise direction can maintain a predetermined gap from the display panel P disposed on the support substrate 220. In this instance, the roller 340 installed at the first end of the stage 330 maintains a height that corresponds to the top surface of the cover panel tape CP.

When a vacuum member (not shown) coupled to the stage 330 releases a vacuum absorption force that is applied to the cover panel tape CP, the cover panel tape CP is separated from the stage 330, and is provided to the display panel P disposed on the support substrate 220 (S130). The release paper provided to the top surface of the cover panel tape CP can be removed by an operator's manual work. These processes are illustrated in FIG. 4.

When the main body driver 320 withdraws the main body 310 from the panel support member 200, as shown in FIG. 5, the roller 340 moves along the top surface of the cover panel tape CP, applies pressure to the cover panel tape CP, and attaches the cover panel tape CP to the display panel P (S140). In this instance, the linear driving member 420 pulls the pocket member 400 down before the roller 340 starts to press the cover panel tape CP, thereby preventing interference between the roller 340 and the pocket member 440.

Figure 6:
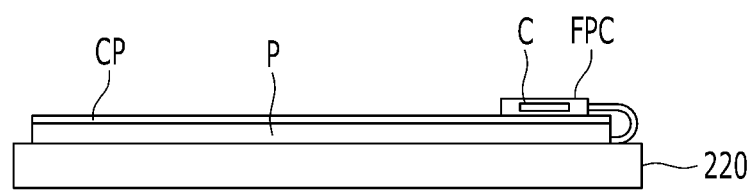
FIG. 6 shows a side view of a display panel to which a cover panel tape and a flexible printed circuit board are attached.
Figure 7:
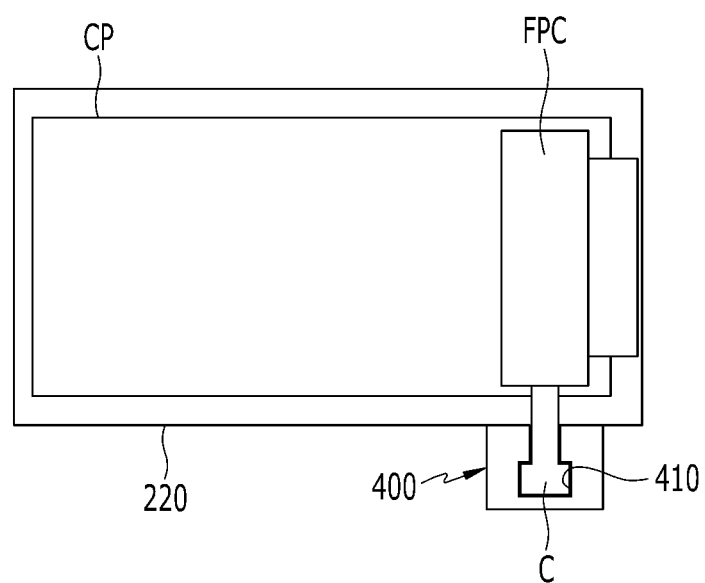
FIG. 7 shows a top plan view of a display panel to which a cover panel tape and a flexible printed circuit board are attached.

FIG. 6 shows a side view of a display panel to which a cover panel tape and a flexible printed circuit board are attached together, and FIG. 7 shows a top plan view of a display panel to which a cover panel tape and a flexible printed circuit board are attached.

Referring to FIG. 6 and FIG. 7, when the cover panel tape CP is attached to the display panel P through the process shown in FIG. 3 through FIG. 5, a flexible printed circuit board (FPCB) FPC is attached to the top surface of the cover panel tape CP. The flexible printed circuit board (FPCB) FPC is attached to the top surface of the cover panel tape CP by the operator's manual operation or an additional device.

When the cover panel tape CP is attached to the flexible printed circuit board (FPCB) FPC, a second end of the flexible printed circuit board (FPCB) FPC is bent and attached to the cover panel tape CP. In this process, the linear driving member 420 lifts the pocket member 400, and the connector C of the flexible printed circuit board (FPCB) FPC is inserted into the groove 410 of the lifted pocket member 400, and is then held by the groove 410.

As described above, the assembly apparatus 10 for a display device according to the exemplary embodiment sequentially performs the process for attaching the cover panel tape CP to the display panel P and the process for attaching the cover panel tape CP to the flexible printed circuit board (FPCB) FPC with a single device.

Accordingly, the assembly apparatus 10 for a display device reduces a number of working processes of the module assembly process and increases process efficiency to improve productivity of the display manufacturing process.

Although the exemplary embodiments have been described, those skilled in the art will readily appreciate that many modifications are possible without materially departing from the novel teachings and advantages. Therefore, the exemplary embodiments disclosed in the present invention are not limited to the technical idea of the present invention and are to explain these exemplary embodiments, and the scope of the technical idea of the present invention is not limited by these exemplary embodiments. The protection range of the present invention should be construed by the claims below, and all technical ideas within an equivalent range thought should be construed as being included within the scope of the present invention.

What is claimed is:

1. An assembly apparatus for a display device, comprising:
   a panel support member supporting a display panel, the support member including a support substrate on a top surface of which the display panel is disposed;
   a tape attaching module being capable of attaching a cover panel tape to the display panel, the tape attaching module comprising a stage that is capable of holding the cover panel tape, the tape attaching module proceeding toward the panel support member or retreating from the panel support member along a direction parallel to a side surface of the support substrate;
   a pocket member disposed at the side surface of the support substrate, the pocket member being movable upward or downward, a top surface of the pocket member having a groove that accommodates a connector of a flexible printed circuit board that is to be attached to the cover panel tape; and
   a linear driving member disposed at the side surface of the support substrate, the linear driving member driving the pocket member upward or downward, the linear driving member configured to drive the pocket member downward before the cover panel tape is attached to the display panel by the tape attaching module.

2. The assembly apparatus of claim 1, wherein the tape attaching module comprises:
   a stage driver rotating the stage with respect to a second end of the stage, the stage being capable of maintaining a horizontal state or an inclined state with respect to the display panel;
   a main body supporting the stage and the stage driver; and
   a main body driver driving the tape attaching module to proceed toward the panel support member or to retreat from the panel support member.

3. The assembly apparatus of claim 2, wherein the stage driver rotates the stage upwardly before the tape attaching module proceeds toward the panel support member, and maintains the upwardly rotated state of the stage while the tape attaching module is proceeding toward the panel support member.

4. The assembly apparatus of claim 3, wherein the stage is capable of holding the cover panel tape while the tape attaching module is proceeding toward the panel support member.

5. The assembly apparatus of claim 3, wherein the stage driver rotates the stage downwardly to the horizontal state before the tape attaching module retreats from the panel support member, and maintains the horizontal state of the stage while the tape attaching module is retreating from the panel support member.

6. The assembly apparatus of claim 2, wherein the tape attaching module further includes a roller installed at a first end of the stage.

7. The assembly apparatus of claim 6, wherein the roller is capable of applying pressure on the display panel while the tape attaching module is retreating from the panel support member.

8. The assembly apparatus of claim 6, wherein the main body driver comprises:
   a guide member extending in a direction parallel to the side surface of the support substrate, the guide member guiding the proceeding or retreating of the tape attaching module; and
   a driving unit installed to the main body, the driving unit coupled with the guide member to be guided by the guide member.

9. The assembly apparatus of claim 6, wherein the stage driver comprises:
   a linear driving unit installed to the main body; and
   a connection link connecting the linear driving unit to the second end of the stage, the connection link including a first end combined with a driving shaft of the linear driving unit in a pivot-rotatable manner, and a second end combined with the second end of the stage in a pivot-rotatable manner.

10. The assembly apparatus of claim 2, wherein the tape attaching module further includes an absorber for alleviating an impact occurring when the stage is rotated.

11. The assembly apparatus of claim 10, wherein the absorber is connected to the stage and is capable of moving upward or downward.

12. The assembly apparatus of claim 1, wherein the groove holds the connector while one end of the flexible circuit board is being attached to the cover panel tape.

13. The assembly apparatus of claim 1, wherein the connector of the flexible printed circuit board is inserted in the groove while the one end of the flexible circuit board is being attached to the cover panel tape.

14. The assembly apparatus of claim 1, wherein the support substrate of the panel support member holds the display panel in a vacuum manner and supports the display panel.

* * * * *